United States Patent
Ito et al.

(10) Patent No.: US 7,579,696 B2
(45) Date of Patent: Aug. 25, 2009

(54) SEMICONDUCTOR DEVICE

(75) Inventors: Sachiyo Ito, Kanagawa (JP); Masahiko Hasunuma, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/142,312

(22) Filed: Jun. 19, 2008

(65) Prior Publication Data

US 2009/0014882 A1   Jan. 15, 2009

(30) Foreign Application Priority Data

Jul. 13, 2007   (JP) ............................... 2007-184955

(51) Int. Cl.
*H01L 23/48*   (2006.01)
*H01L 23/52*   (2006.01)
(52) U.S. Cl. ....................... 257/784; 257/758; 257/762; 257/766; 257/773
(58) Field of Classification Search .................. 257/758, 257/761–766, 773–775, 781, 784, E23.02, 257/E23.152, E23.194
See application file for complete search history.

(56) References Cited

U.S. PATENT DOCUMENTS

| | | | | |
|---|---|---|---|---|
| 4,636,832 | A * | 1/1987 | Abe et al. ..................... | 257/786 |
| 6,100,589 | A * | 8/2000 | Tanaka ......................... | 257/758 |
| 6,958,542 | B2 | 10/2005 | Hasunuma et al. | |
| 7,049,701 | B2 | 5/2006 | Usui | |
| 7,067,922 | B2 | 6/2006 | Hasunuma et al. | |
| 7,285,859 | B2 | 10/2007 | Hasunuma et al. | |
| 7,315,072 | B2 * | 1/2008 | Watanabe ................... | 257/503 |
| 7,339,256 | B2 | 3/2008 | Nakamura et al. | |
| 2005/0167842 | A1 | 8/2005 | Nakamura et al. | |
| 2007/0204243 | A1 | 8/2007 | Ito et al. | |

FOREIGN PATENT DOCUMENTS

JP   2005-142553   6/2005
JP   2005-229086   8/2005

OTHER PUBLICATIONS

Ito, S. et al., "Semiconductor Device," U.S. Appl. No. 11/964,336, filed Dec. 26, 2007.

* cited by examiner

*Primary Examiner*—Hung Vu
(74) *Attorney, Agent, or Firm*—Finnegan, Henderson, Farabow, Garrett & Dunner, L.L.P.

(57) ABSTRACT

A semiconductor device includes an effective wire formed above a substrate in a multilayer interconnection structure and having a first electrode pad in a top layer; a first reinforcing material formed in the multilayer interconnection structure like surrounding the effective wire; a protective film configured to protect a final surface of the multilayer interconnection structure; and a second reinforcing material formed at a position in contact with the protective film and also between an area in which the effective wire is formed and a chip area end, the second reinforcing material being constituted by a film pattern whose Young's modulus is larger than that of a conductor constituting the first electrode pad and that of a conductor constituting the first reinforcing material.

20 Claims, 9 Drawing Sheets

SEMICONDUCTOR DEVICE

CROSS-REFERENCE TO RELATED APPLICATION

This application is based upon and claims the benefit of priority from prior Japanese Patent Application No. 2007-184955 filed on Jul. 13, 2007 in Japan, the entire contents of which are incorporated herein by reference.

BACKGROUND OF THE INVENTION

1. Field of the Invention

The present invention relates to a semiconductor device and, for example, relates to a semiconductor device having a mechanism for reinforcing a multilayer interconnection structure.

2. Related Art

In recent years, with ever higher degrees of integration and higher performance of semiconductor integrated circuits (LSI), new microprocessing technologies have been developed. In particular, to achieve an ever faster speed of LSI, there has been a growing trend recently to replace the conventional wire material of aluminum (Al) alloys with copper (Cu) or Cu alloys (hereinafter, called Cu together) having lower resistance. Since it is difficult to apply the dry etching method, which is frequently used for forming an Al alloy wire, to Cu for microprocessing, the so-called damascene process is mainly adopted for Cu, in which a Cu film is deposited onto a dielectric film to which groove processing has been provided and then the Cu film is removed except in portions where the Cu film is embedded inside a groove by chemical-mechanical polishing (CMP) to form an embedded wire. Further, when multilayer Cu interconnection should be formed, particularly a wire formation method called a dual damascene structure may be used. According to the method, a dielectric film is deposited onto a lower layer wire and predetermined via holes and trenches for upper layer wire are formed, and then Cu to be a wire material is embedded in the via holes and trenches simultaneously and further unnecessary Cu in the upper layer is removed by CMP for planarization to form an embedded wire.

Recently, the use of a low dielectric constant film (low-k film) having a low relative dielectric constant as an inter-level dielectric is studied. That is, an attempt is made to reduce parasitic capacitance between wires by using a low dielectric constant film (low-k film) whose relative dielectric constant k is 3.4 or less, instead of a silicon oxide ($SiO_2$) film whose relative dielectric constant k is about 4.1.

Here, a low dielectric constant film is formed by reducing the density of material thereof or eliminating polarity in the material. For example, to reduce the density of material, the material is commonly made porous. Thus, a low dielectric constant film has a low density and commonly has low values of mechanical physical properties such as the Young's modulus. That is, the material itself of a low dielectric constant film has low strength. In addition, a low dielectric constant film has a film structure of low polarity to reduce the dielectric constant in the film. Thus, adhesion density at a lamination interface of a laminated film in which low dielectric constant films or a low dielectric constant film and other films are laminated is weak. More specifically, the material of film deteriorates due to penetration of a gas used for forming a via hole or a trench in the low dielectric constant film, working processes or the like. Thus, mechanical strength of the material itself of a low dielectric constant film may be degraded or adhesion strength at an interface of a laminated film including a low dielectric constant film may be degraded.

Weaknesses of film strength of low dielectric constant films and those of adhesion strength at the interface of laminated films including a low dielectric constant film produce a big bottleneck particularly in a multilayering process in which wires in a semiconductor device are formed into a multilayer structure. To eliminate the bottleneck, an attempt is made to improve reliability by arranging dummy wires as reinforcing materials in a low dielectric constant film.

Defects resulting from weaknesses of film strength of low dielectric constant films and those of adhesion strength at the interface of laminated films including a low dielectric constant film specifically include short-circuit defects due to dielectric breakdown around a via in a heat process such as sintering, interface peeling defects in the CMP process, dielectric breakdown under padding during bonding or probing, chipping during dicing, and dielectric interface peeling during a reliability test (such as TCT) after packaging.

Arrangement of dummy wires around effective wires has been effective in reliability improvement for short-circuit defects due to dielectric breakdown around a via in a heat process such as sintering, interface peeling defects in the CMP process, and dielectric breakdown under padding during bonding or probing. For chipping during dicing and dielectric interface peeling during a reliability test (such as TCT) after packaging, that is, dielectric peeling defects starting from a chip end, measures to control dielectric peeling defects starting from a chip end have been taken by arranging a via ring or dummy wire on a scribe line and in an area between the scribe line and an area where effective wires are arranged in the chip (See Published Unexamined Japanese Patent Application No. 2005-229086 (JP-A-2005-229086), for example).

In recent years, with an increasingly lower dielectric constant of inter-level dielectric of LSI and lower mechanical strength involved therein, the coverage factor in a chip of a via ring or dummy wire arranged on a scribe line and in a boundary part between the scribe line and an area where effective wires are arranged in the chip is becoming increasingly higher and a structure thereof more complex. More specifically, a via ring arranged at a boundary part between an effective wiring area and a scribe line assumes the role of suppressing penetration of moisture content or development of cracks from a chip end, and the via ring is formed, for example, from a wiring structure arranged like surrounding the effective wiring area ranging from the bottom Cu wiring layer to the top Cu wiring layer or an electrode pad thereon and a wall-shaped via structure connecting these layers vertically (See Published Unexamined Japanese Patent Application No. 2005-142553 (JP-A-2005-142553), for example). At least one via ring (one structure) is arranged in a boundary part between an effective wiring area and a scribe line toward and outer periphery. The number of via rings increases with an increasingly lower dielectric constant of dielectric film and lower mechanical strength involved therein, and even as many via rings as 10 may be arranged. Such an increase in the number of via rings reduces a substantially effective wiring area in the chip, posing a problem for still higher integration.

The structure of a dummy wire arranged on a via ring or scribe line is becoming more complex such as a shape in which a plurality of cylindrical vias or wall-shaped vias is connected to one wire and also the coverage factor is becoming higher. This is intended to suppress development of cracks from a chip end and, in the meantime, a new problem resulting from more complex shapes arises. If a wire of metal such as Cu is formed in a dielectric film, a difference of the coefficient of linear expansion between the dielectric film and wire material causes thermal stress at a dielectric film/wire interface during a heat process. In a dummy wire having the above complex shape and formed on a via ring or scribe line, the thermal stress is likely to become larger than that in an effective wiring area. This thermal stress causes no problem when the dielectric film has sufficient mechanical strength, but if a via ring or dummy wire having a complex shape and a high coverage factor is arranged in a low dielectric constant film having low mechanical strength, there is a danger that dielectric film cracks may arise due to thermal stress caused at a dielectric film/wire interface during a heat process. That is, a via ring or dummy wire arranged to control cracks from a chip end itself is likely to become a starting point of dielectric film cracks as the shape thereof becomes more complex and the coverage factor becomes higher.

In a semiconductor device using a low dielectric constant film as inter-level dielectric, as described above, a dummy wire on a via ring or scribe line causes a bottleneck in higher integration and it is very likely that dielectric film cracks starting from the dummy wire on the via ring or scribe line occur during a thermal process. Thus, it is very likely that a fatal defect is caused in semiconductor devices or fabricating processes thereof. That is, it is likely that performance or quality of semiconductor devices deteriorates, leading to lower reliability of semiconductor devices. At the same time, it is likely that yields of semiconductor devices drop with defective semiconductor devices being manufactured, leading to lower production efficiency of semiconductor devices.

BRIEF SUMMARY OF THE INVENTION

A semiconductor device in an embodiment of the present invention includes an effective wire formed above a substrate in a multilayer interconnection structure and having a first electrode pad in a top layer; a first reinforcing material formed in the multilayer interconnection structure like surrounding the effective wire; a protective film configured to protect a final surface of the multilayer interconnection structure; and a second reinforcing material formed at a position in contact with the protective film and also between an area in which the effective wire is formed and a chip area end, the second reinforcing material being constituted by a film pattern whose Young's modulus is larger than that of a conductor constituting the first electrode pad and that of a conductor constituting the first reinforcing material.

DETAILED DESCRIPTION OF THE INVENTION

First Embodiment

In each embodiment shown below, a device whose peeling resistance between wiring layers in a multilayer interconnection is improved will be described.

Figure 1:
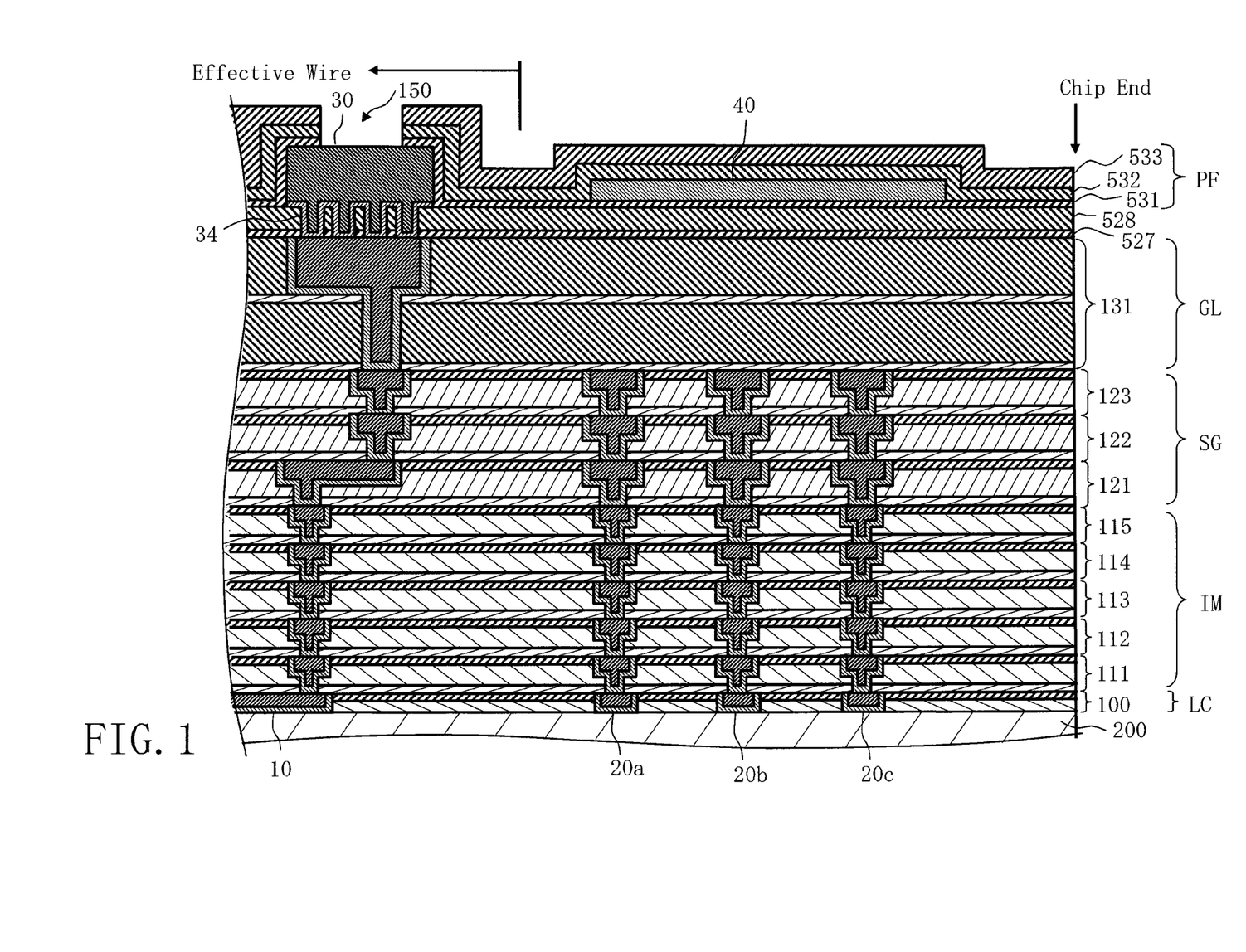
FIG. 1 is a conceptual diagram exemplifying a cross section of a semiconductor device according to a first embodiment.

The first embodiment will be described below with reference to drawings. FIG. 1 is a conceptual diagram exemplifying the cross section of a semiconductor device according to the first embodiment. When a multilayer interconnection structure is formed, wiring layers are laminated by classifying wiring layers into wiring layer groups having a common minimum wire width. In the example shown in FIG. 1, a local (LC) layer group is formed on a substrate 200, an intermediate (IM) layer group thereon, a semi-global (SG) layer group thereon, and a global (GL) layer group thereon. Then, the LC layer group consists, for example, of one layer of a wiring layer 100. The IM layer group consists, for example, of five layers of wiring layers 111, 112, 113, 114, and 115. The SG layer group consists, for example, of three layers of wiring layers 121, 122, and 123. The GL layer group consists, for example, of one layer of a wiring layer 131. The number of laminated wiring layers in each group is not limited to the above example and may be more or less. The minimum wire width in each group increases from the LC layer group to the GL layer group. Moreover, a wire and a via plug for connecting the wire to a wire in the wiring layer below are formed in each wiring layer excluding the wiring layer 100. A silicon wafer of 300 mm in diameter, for example, is used as the substrate 200. Here, portions below the Cu wire, for example, a device portion, a tungsten (W) plug portion connected to the device portion and the like are not illustrated. A diffusion prevention film 527 is formed on a wiring layer 131, which is the top layer of the GL layer group. Moreover, on an upper layer side thereof, an electrode pad 30 is connected to an effective wire 10 of the wiring layer 131 in the GL layer group via a contact plug. In this manner, the effective wire 10 is formed into a multilayer interconnection structure on the substrate 200. Then, the electrode pad 30 is formed in the top layer of the effective wire 10.

Wiring layers in each group have a common minimum wire width and also have a main dielectric film having the relative dielectric constant k appropriate to the wire width thereof formed therein. That is, the relative dielectric constant k of a main dielectric film is formed to have substantially the same value in each wiring layer of each group. In the LC layer group, the IM layer group, and the SG layer group, a dielectric film whose relative dielectric constant k is 3.4 or less, for example, about 2.8 is used. For the SG layer group, a dielectric film whose relative dielectric constant k is greater than 3.4 may be used. In the GL layer group, a dielectric film whose relative dielectric constant k is about 4.1 is used. Thus, if the effective wire 10 is formed by using a low-k film whose relative dielectric constant k is 3.4 or less for at least one layer as an inter-level dielectric, a via ring 20 (first reinforcing material) formed, as described above, like surrounding or "enclosing" the effective wire 10 is arranged from the viewpoint of reinforcing mechanical strength and preventing penetration of moisture content. Though, here, an example in which a plurality of via rings 20a to 20c is arranged in three rows is shown, the present embodiment is not limited to this, and more or less via rings may be arranged.

Then, a laminated protective film PF (passivation film) for protecting a final surface of the multilayer interconnection structure is arranged in such a way that an opening 150 is formed in at least a portion of an upper surface of the electrode pad 30. Here, as described above, the via rings 20a to 20c arranged to control cracks from a chip end are themselves likely to become a starting point of dielectric film cracks as the shape thereof becomes more complex and the coverage factor becomes higher. Thus, in the first embodiment, instead of increasing the number of rows of the via ring 20, a crack stopper film 40 (second reinforcing material) is further arranged in the laminated protective film PF in the via ring configuration in which the number of rows is rather reduced. Here, the crack stopper film 40 is formed at a position at which the crack stopper film 40 is in contact with the protective film of one of layers of the laminated protective film PF and also between an area where the effective wire 10 is formed and a chip area end.

Figure 2:
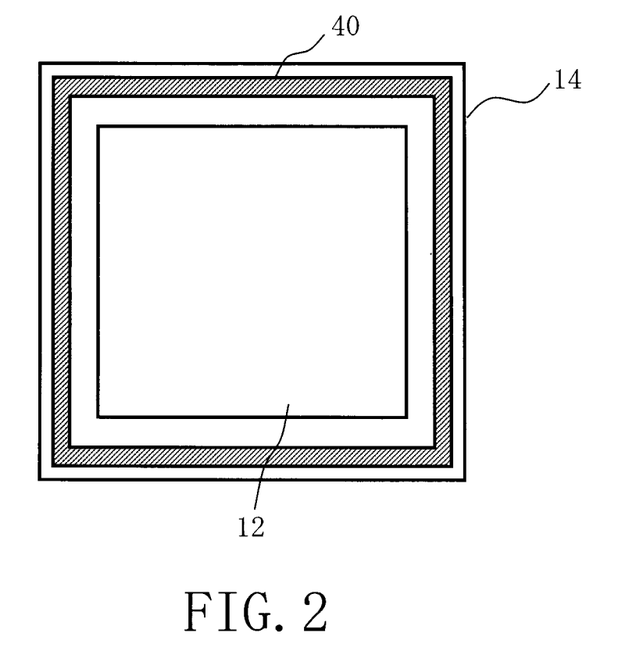
FIG. 2 is a conceptual diagram of the semiconductor device viewed from above for illustrating an arrangement position of a crack stopper film in the first embodiment.

FIG. 2 is a conceptual diagram of the semiconductor device viewed from above for illustrating an arrangement position of a crack stopper film in the first embodiment. As shown in FIG. 2, the crack stopper film 40 is arranged in an area between an end of a chip 14 and an effective wiring area 12 where the effective wire 10 is formed and arranged like surrounding the effective wiring area 12.

Figure 3:
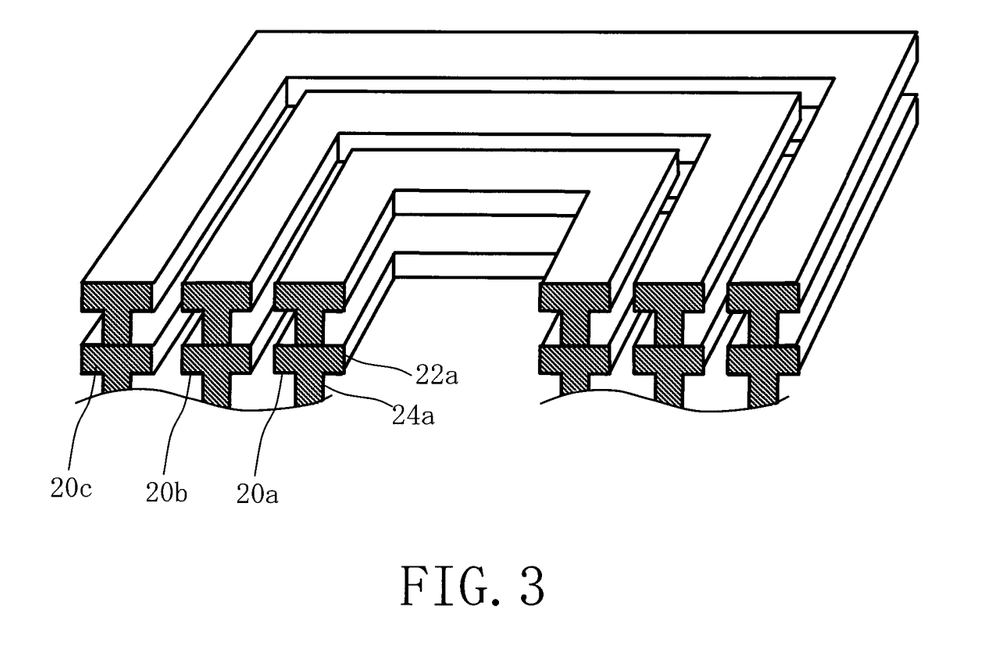
FIG. 3 is a conceptual diagram exemplifying via rings in the first embodiment.

FIG. 3 is a conceptual diagram exemplifying via rings in the first embodiment. The via ring 20 is constituted by a dummy wire part 22 in a multilayer interconnection structure and a via fence 24 connecting the dummy wire parts 22 vertically. Moreover, these are formed like continuously surrounding the effective wire 10. Widths of the dummy wire part 22 and the via fence 24 are adjusted to the wire width of each wiring layer in FIG. 1, but the present embodiment is not limited to this. For example, the dummy wire part 22 and the via fence 24 may be formed with the same width regardless of the wiring layer group. Or, for example, the dummy wire part 22 may be formed to a width of 1 μm and the via fence 24 to a width of 0.5 μm. The method of fabricating each layer will be described one by one below.

Figure 4:
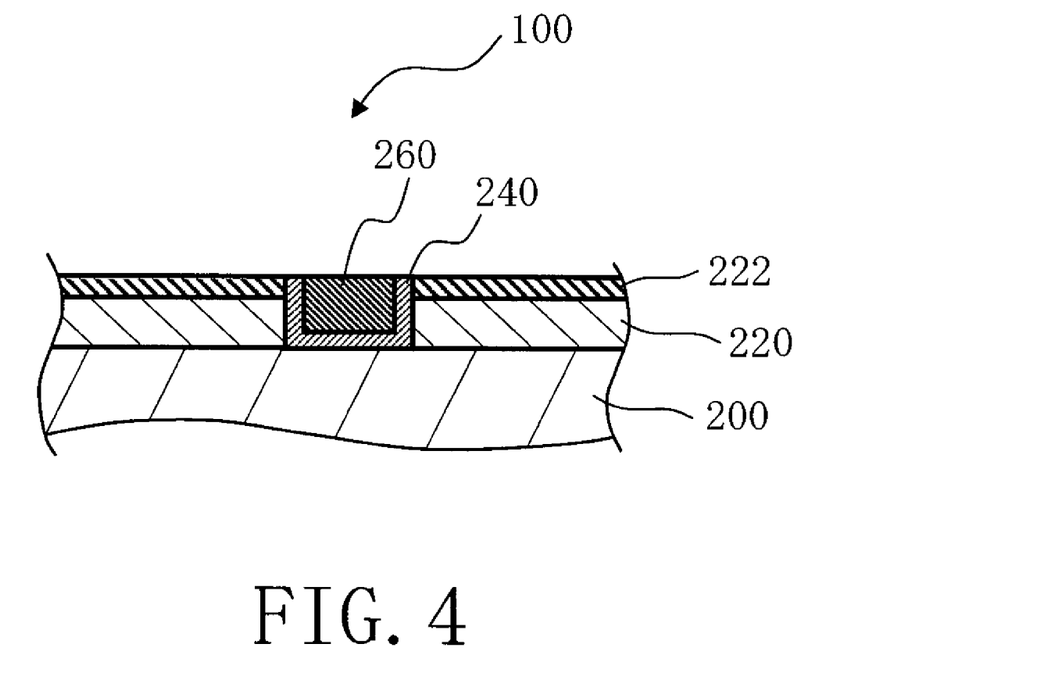
FIG. 4 is a conceptual diagram exemplifying the cross section of an LC wiring layer in the first embodiment.

FIG. 4 is a conceptual diagram exemplifying the cross section of the LC wiring layer in the first embodiment. First, a dielectric film 220 using a porous low-dielectric constant dielectric material is formed on the substrate 200 to a thickness of, for example, 100 nm. Porous silicon carbonate (SiOC) may suitably be used as the material of the dielectric film 220. Using a porous SiOC film, an inter-level dielectric whose relative dielectric constant k is about 2.8 can be obtained. Here, the dielectric film 220 is formed, as an example, using material whose main component is methylsiloxane. In addition to polymethylsiloxane whose main component is methylsiloxane, a film having siloxane backbone structures such as polysiloxane, hydrogen silsesquioxane, and methylsilsesquioxane may be used as materials of the dielectric film 220. The SOD (spin on dielectric coating) method by which a thin film is formed by spin-coating and heat-treating a solution may be used as a formation method. The dielectric film 220 is formed, for example, by forming a film by a spinner, baking the substrate on a hot plate in a nitrogen atmosphere at 80° C. for one minute, and finally curing the substrate at 80° C., which is higher than that during baking on the hot plate in the nitrogen atmosphere, for 30 minutes.

Then, by depositing SiOC to a thickness of, for example, 20 nm onto the dielectric film 220 by the CVD method, a cap dielectric film 222 is formed. In addition to SiOC whose relative dielectric constant k is, for example, about 3.0, $SiO_2$ whose relative dielectric constant k is about 4.0 can be used as the cap dielectric film 222. By forming the cap dielectric film 222, the dielectric film 220 of SiOC whose mechanical strength is weak can be protected.

Then, a trench for making a damascene wire in lithography and dry etching processes is formed in the cap dielectric film 222 and the dielectric film 220. Here, a trench for the effective wire 10 and that for forming the dummy wire part 22 of the via rings 20a to 20c are formed.

Then, a barrier metal film 240 is formed in the trenches and on the surface of the cap dielectric film 222 by depositing a barrier metal material, for example, at 150° C. by the physical vapor deposition (PVD) method such as sputtering. Materials of the barrier metal film 240 include, for example, tantalum (Ta), titanium (Ti), niobium (Nb), tungsten (W), ruthenium (Ru), rhodium (Rh), alloys containing these elements, compounds thereof, and laminated films thereof. Particularly nitrides such as tantalum nitride (TaN), titanium nitride (TiN), and nitride niobium (NbN) are suitable as compounds. Then, a Cu thin film to be a cathode electrode in the next electro-plating process is caused to deposit (form) on inner walls of the trenches and the surface of the substrate 200 where the barrier metal film 240 is formed as a seed film by the PVD method such as sputtering. Then, with the seed film as the cathode electrode, a Cu film 260 (an example of copper containing film) is caused to deposit inside the trenches and on the surface of the substrate 200 by the electrochemical deposition method such as electro-plating. Then, annealing treatment is provided. An electric furnace or hot plate is used to perform annealing in a temperature range of 150 to 300° C. in a forming gas or nitrogen atmosphere for about one hour for the electric furnace and about one minute for the hot plate. Then, the extra Cu film 260 and barrier metal film 240 deposited outside the trenches in such a state after annealing treatment are removed by CMP to form a damascene wire to form the wiring layer 100. For example, a Cu wire whose minimum wire width is 65 nm can be formed. Then, for example, a wiring layer whose minimum wiring rule of line and space is 65 nm/65 nm and whose wiring height is 120 nm can be formed.

Here, instead of SiOC, an organic dielectric film, a carbon containing $SiO_2$ film (SiOC), a porous silica film, a polymer membrane, or an amorphous carbon film (F doped) may also suitably be used for the main dielectric film 220 of the wiring layer 100. Organic compounds having unsaturated bond such as polyarylene and polybenzooxazole can be used as the material of the organic dielectric film. Using these materials, a dielectric film whose relative dielectric constant k is 3.4 or less can be formed. The cap dielectric film 222 on the dielectric film 220 may be omitted. The carbon containing $SiO_2$ film can suitably be formed using the chemical vapor deposition (CVD) method, instead of the SOD method. All materials formed by the SOD method and containing SiOC have the relative dielectric constant 3.4 or less. The dielectric film 220 may also be formed from a laminated film containing at least one of these materials.

Figure 5:
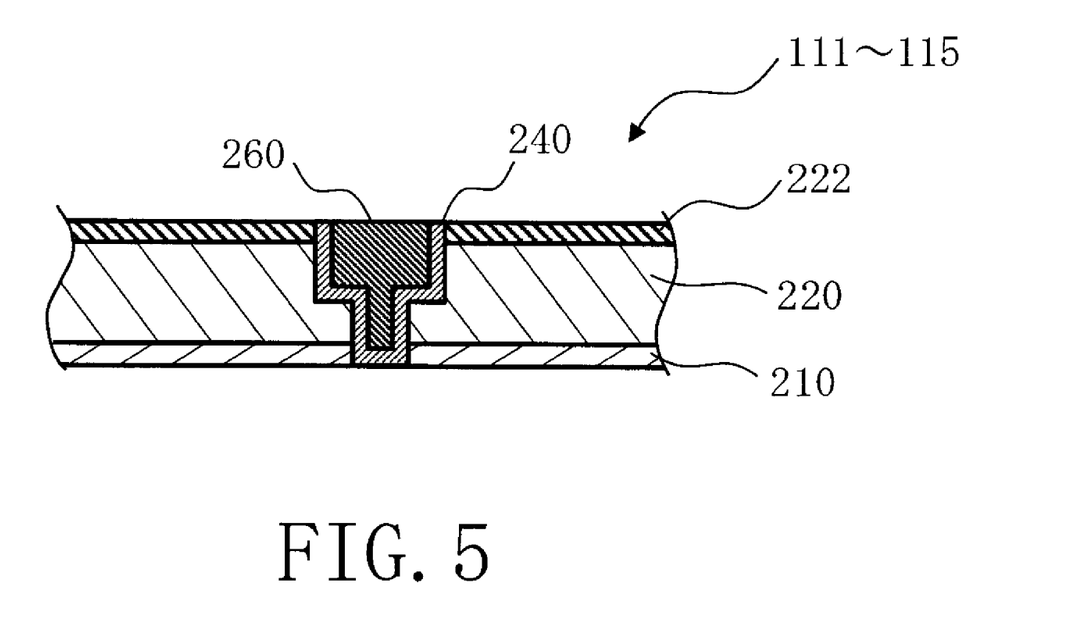
FIG. 5 is a conceptual diagram exemplifying the cross section of an IM wiring layer in the first embodiment.

FIG. 5 is a conceptual diagram exemplifying the cross section of the IM wiring layer in the first embodiment. First, an etching stopper film 210 is deposited onto the wiring layer 100 by the CVD method to a thickness of, for example, 30 nm. As the material of the etching stopper film 210, for example, silicon carbonitride (SiCN), silicon carbide (SiC), silicon nitride (SiN), or a laminated film of these may suitably be used.

Then, like the LC wiring layer, the dielectric film 220 using a porous low-dielectric constant dielectric material is formed on the etching stopper film 210 to a thickness of, for example, 180 nm. Here, the same SiOC film as that of the main dielectric film of the LC wiring layer is formed. Using a porous SiOC film, an inter-level dielectric whose relative dielectric constant k is about 2.8 can be obtained. Thus, in addition to polymethylsiloxane whose main component is methylsiloxane, a film having siloxane backbone structures such as polysiloxane, hydrogen silsesquioxane, and methylsilsesquioxane may be used as the material of the dielectric film 220. The formation method is also the same as that of the LC wiring layer. Or, further, curing by electron beam (EB) irradiation, ultraviolet (UV) irradiation, or heat may suitably be performed.

Then, SiOC is deposited onto the dielectric film 220 by the CVD method to a thickness of, for example, 30 nm to form the cap dielectric film 222. Here, the same SiOC film as that of the cap dielectric film 222 of the LC wiring layer is formed. Thus, for example, SiOC whose relative dielectric constant k is about 3.0 or $SiO_2$ whose relative dielectric constant k is about 4.0 can be used as the cap dielectric film 222. By forming the cap dielectric film 222, the dielectric film 220 whose mechanical strength is weak can be protected.

Then, a trench and a lower-layer hole (via hole) for making a damascene wire in the lithography and dry etching processes are formed in the cap dielectric film 222, the dielectric film 220, and the etching stopper film 210. Also here, a recess for forming the dummy wiring part 22 and the via fence 24 of the via rings 20a to 20c is formed together with the trench and via hole for the effective wire 10. Then, the barrier metal film 240 similar to that in the LC wiring layer is formed in the via hole and trench and on the surface of the cap dielectric film 222 by the PVD method such as sputtering. Then, a Cu thin film to be a cathode electrode in the next electro-plating process is caused to deposit (form) on the inner walls of the via hole and trench and the surface of the substrate 200 where the barrier metal film 240 is formed as a seed film by sputtering or the like. Then, with the seed film as the cathode electrode, the Cu film 260 (an example of copper containing film) is caused to deposit inside the via hole and trench and on the surface of the substrate 200 by the electrochemical deposition method such as electro-plating. Then, after annealing treatment, the extra Cu film 260 and barrier metal film 240 deposited outside the trench in such a state are removed by CMP to form the wiring layer 111 by forming a damascene wire. For example, a Cu wire whose minimum wire width is 70 nm can be formed. Then, for example, a wiring layer whose minimum wiring rule of line and space is 70 nm/70 nm and whose wiring height is 130 nm can be formed. Also, a via plug whose via diameter is 70 nm and whose height is 110 nm can be formed.

Here, like the LC wiring layer, instead of SiOC, a carbon containing $SiO_2$ film (SiOC), a porous silica film, a polymer membrane, or an amorphous carbon film (F doped) may also be suitably used for the main dielectric film 220 of the wiring layer 111. Using these materials, a dielectric film whose relative dielectric constant k is 3.4 or less can be formed. The dielectric film 220 may also be formed from a laminated film containing at least one of these materials. The cap dielectric film 222 on the dielectric film 220 may be omitted.

Then, the wiring layer 112 is formed on the wiring layer 111. Subsequently, the wiring layer 113 is formed on the wiring layer 112. Subsequently, the wiring layer 114 is formed on the wiring layer 113. Subsequently, the wiring layer 115 is formed on the wiring layer 114. The formation method of the wiring layers 112 to 115 is the same as that of the wiring layer 111. In this manner, a plurality (here five layers) of the wiring layers 111, 112, 113, 114, and 115 of the IM wiring layer group is laminated.

Figure 6:
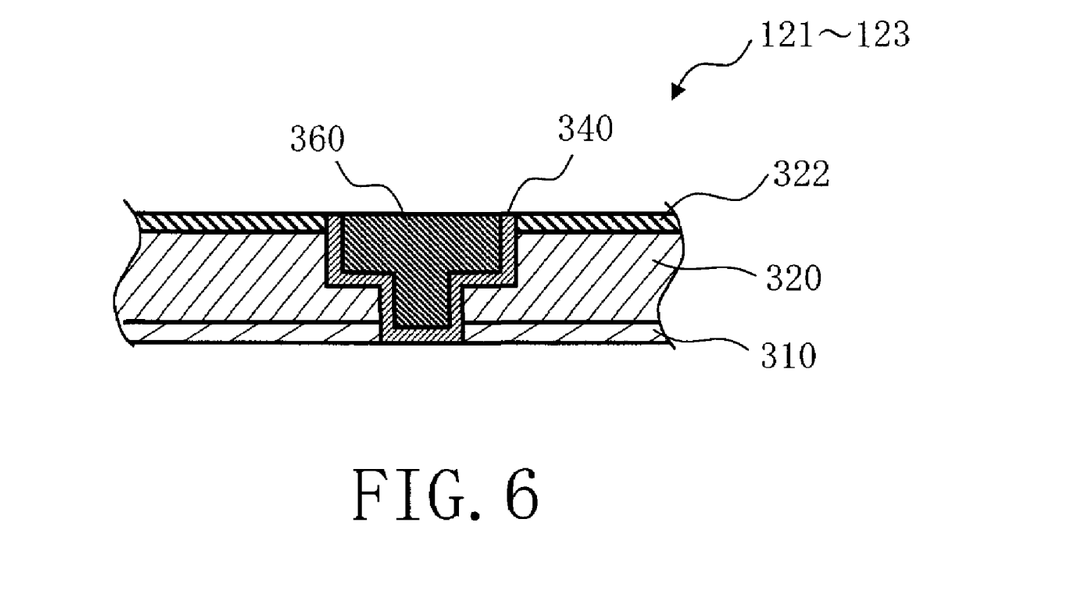
FIG. 6 is a conceptual diagram exemplifying the cross section of an SG wiring layer in the first embodiment.

Next, the wiring layer 121 is formed on the wiring layer 115, which is the top layer of the IM wiring layer group. FIG. 6 is a conceptual diagram exemplifying the cross section of the SG wiring layer in the first embodiment. First, SiCN is deposited onto the wiring layer 115 to a thickness of, for example, 70 nm by the CVD method to form a thin film of an etching stopper film 310. For example, SiCN, SiC, SiN, or a laminated film thereof is suitably used as the material of the etching stopper film 310.

Then, a dielectric film 320 having a thickness of, for example, 400 nm is formed on the etching stopper film 310. Here, the same material as that of the dielectric film 220 in the IM wiring layer group is used. That is, polymethylsiloxane is applied according to the SOD method. Like the dielectric film 220, in addition to polymethylsiloxane whose main component is methylsiloxane, for example, a film having siloxane backbone structures such as polysiloxane, hydrogen silsesquioxane, and methylsilsesquioxane may be used as the material of the dielectric film 320. The formation method is also the same as that of the LC wiring layer or IM wiring layer. Or, further, curing by electron beam (EB) irradiation, ultraviolet (UV) irradiation, or heat may suitably be performed.

Next, a cap dielectric film 322 is formed by depositing SiOC onto the dielectric film 320 to a thickness of, for example, 50 nm by the CVD method. As the cap dielectric film 322, for example, $SiO_2$ whose relative dielectric constant k is about 4.0 may be used. By forming the cap dielectric film 322, the dielectric film 320 of SiOC whose mechanical strength is weak can be protected.

Subsequently, a trench and a lower-layer hole (via hole) for making a damascene wire in the lithography and dry etching processes are formed in the cap dielectric film 322, the dielectric film 320, and the etching stopper film 310. Also here, a recess for forming the dummy wiring part 22 and the via fence 24 of the via rings 20a to 20c is formed together with the trench and via hole for the effective wire 10. A barrier metal film 340 using a barrier metal material is formed in the via hole and trench and on the surface of the cap dielectric film 322. That is, a thin film of Ta film is deposited to a thickness of, for example, 5 nm in a sputtering device using the sputter process, which is a kind of the PVD method, to form the barrier metal film 340. Materials of the barrier metal film include, as described above, Ta, Ti, Nb, W, Ru, Rh, alloys containing these elements, compounds thereof, and laminated films thereof. Then, a Cu thin film to be a cathode electrode in the next electro-plating process is caused to deposit (form) on the inner walls of the via hole and trench and the surface of the substrate 200 where the barrier metal film 340 is formed as a seed film by sputtering or the like.

Then, with the seed film as the cathode electrode, a Cu film 360 (an example of copper containing film) is caused to deposit inside the via hole and trench and on the surface of the substrate 200 by the electrochemical deposition method such as electro-plating. Then, after annealing treatment, the extra Cu film 360 and barrier metal film 340 deposited outside the trench in such a state are removed by CMP to form a wiring layer 121 by forming a damascene wire. For example, a Cu wire whose minimum wire width is 140 nm can be formed. Then, for example, a wiring layer whose minimum wiring rule of line and space is 140 nm/140 nm and whose wiring height is 280 nm can be formed. Also, a via plug whose via diameter is 140 nm and whose height is 230 nm can be formed.

Here, like the main dielectric film 220 of, for example, the LC wiring layer, instead of SiOC, an organic dielectric film, a carbon containing $SiO_2$ film (SiOC), a porous silica film, a polymer membrane, or an amorphous carbon film (F doped) may also suitably be used for the main dielectric film 320 of the wiring layer 121. Using these materials, a dielectric film whose relative dielectric constant k is 3.4 or less can be formed. The dielectric film 320 may also be formed from a laminated film containing at least one of these materials. Though a low-k film is used in FIG. 1, a dielectric film whose relative dielectric constant is 3.4 or more may also be used. The cap dielectric film 322 on the dielectric film 320 may be omitted.

Then, the wiring layer 122 is formed on the wiring layer 121. Subsequently, the wiring layer 123 is formed on the wiring layer 122. The formation method of the wiring layers 122 and 123 is the same as that of the wiring layer 121. In this manner, a plurality (here three layers) of the wiring layers 121, 122, and 123 of the SG wiring layer group is laminated.

Figure 7:
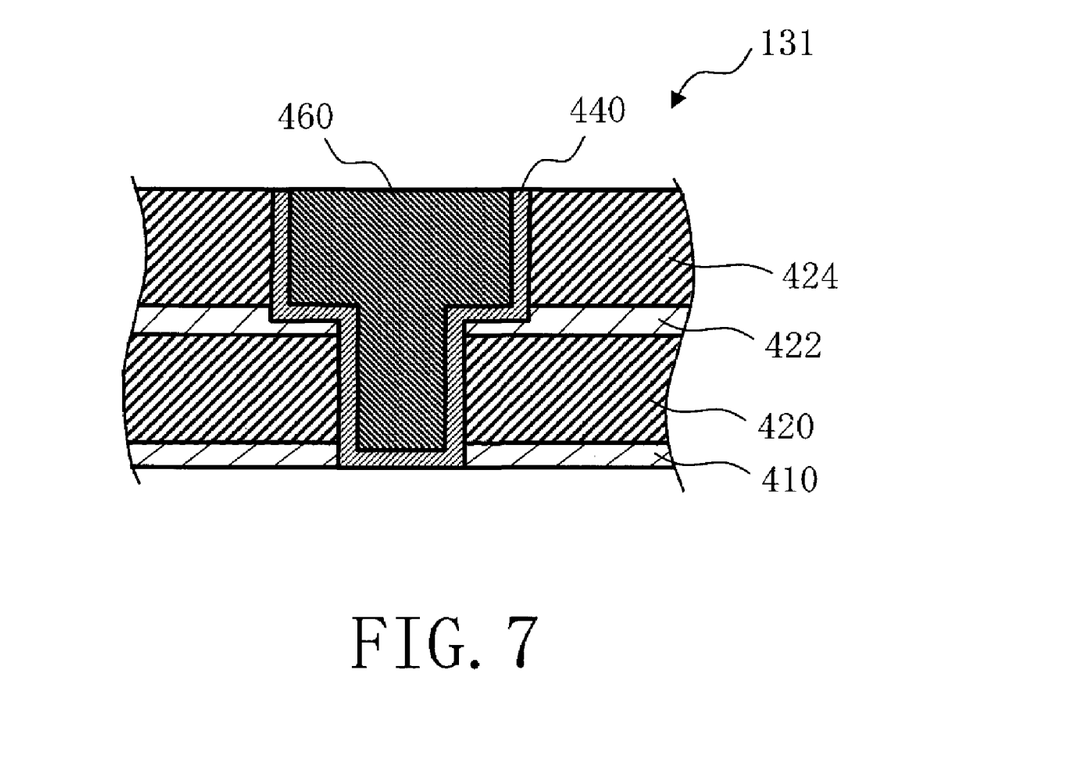
FIG. 7 is a conceptual diagram exemplifying the cross section of an GL wiring layer in the first embodiment.

Next, the wiring layer 131 is formed on the wiring layers 123, which is the top layer of the SG wiring layer group. FIG. 7 is a conceptual diagram exemplifying the cross section of the GL wiring layer in the first embodiment. First, a thin film of an etching stopper film 410 is formed by depositing SiCN onto the wiring layer 123 by the CVD method to a thickness of, for example, 100 nm. As the material of the etching stopper film 410, for example, SiCN, SiC, SiN, or a laminated film of these may suitably be used. Then, $SiO_2$ is caused to deposit onto the etching stopper film 410 by using the CVD method to a thickness of, for example, 700 nm to form the dielectric film 420. The main dielectric film 420 for a via plug of k=4.1 can thereby be formed. Then, an etching stopper film 422 is formed by depositing SiN onto the dielectric film 420 by the CVD method to a thickness of, for example, 150 nm. In addition to SiN, SiCN, SiC, or a laminated film of these may suitably be used as the material of the etching stopper film 422. Subsequently, $SiO_2$ is caused to deposit onto the etching stopper film 422 by using the CVD method to a thickness of, for example, 1000 nm to form a dielectric film 424. The main dielectric film 424 for wire of k=4.1 can thereby be formed.

Then, a barrier metal film 440 is formed in the via hole opened with the etching stopper film 410 as an etching stopper and the trench opened with the etching stopper film 422 as an etching stopper. Materials of the barrier metal film 440 include, as described above, Ta, Ti, Nb, W, Ru, Rh, alloys containing these elements, compounds thereof, and laminated films thereof. Then, a Cu film 460 is caused to deposit onto the inner walls of the via hole and trench on which the barrier metal film 440 is formed. Subsequently, after annealing treatment and CMP, the wiring layer 131 is formed by forming a dual damascene wire. In the wiring layer 131, for example, a Cu wire whose minimum wire width is 1000 nm can be formed. Then, for example, a wiring layer whose minimum wiring rule of line and space is 1000 nm/1000 nm and whose wiring height is 1100 nm can be formed. Also, a via plug whose via diameter is 600 nm and whose height is 850 nm can be formed. In this manner, the wiring layer 131 of the GL wiring layer group is formed.

Next, SiN is caused to deposit onto the wiring layer 131 of the GL wiring layer group to a thickness of, for example, 70 nm to form the diffusion prevention film 527. In addition to SiN, SiCN, SiC, or a laminated film thereof may be used as the material of the diffusion prevention film 527.

Next, a plug layer in which the electrode pad (first electrode pad) 30 and a contact plug of the electrode pad 30 are arranged will be formed. First, an $SiO_2$ film is caused to deposit onto the diffusion prevention film 527 by the CVD method to form a dielectric film 528. Then, a barrier metal 34 is formed in the contact hole opened with the diffusion prevention film 527 as an etching stopper and on the surface of the dielectric film 528. Materials of the barrier metal film 34 include, as described above, Ta, Ti, Nb, W, Ru, Rh, alloys containing these elements, compounds thereof, and laminated films thereof. Then, an Al film is caused to deposit onto the inner wall in the contact hole and on the surface of the dielectric film 528 where the barrier metal film 34 is formed. Then, the electrode pad 30 using the Al material is formed in the lithography and dry etching processes.

Subsequently, an SiN film 531 to be the first layer in the laminated protective film PF is caused to deposit onto the electrode pad 30 and the surface of the dielectric film 528 at 380° C. by using the plasma CVD method. Then, a chrome (Cr) film is caused to deposit onto the whole surface of the SiN film 531 by using the PVD method such as sputtering and a crack stopper film 40 (second reinforcing material) surrounding the effective wire 10, as shown in FIG. 2, is formed in the lithography and dry etching processes. The crack stopper film 40 is formed from film patterns of a conductor whose Young's modulus is larger than that of conductors constituting the electrode pad 30 and the via ring 20. For example, the conductor constituting the electrode pad 30 is constituted by a portion of the Al film and the barrier metal film 34. In this case, a combined Young's modulus is a value obtained by adding a value obtained by multiplying the volume proportion of the Al film by the Young's modulus of the Al film (80 GPa) and a value obtained by multiplying the volume proportion of the barrier metal film 34 by the Young's modulus of the barrier metal material. The crack stopper film 40 is formed so that the Young's modulus of the crack stopper film 40 is larger than the combined Young's modulus of the electrode pad 30. Similarly, the conductor constituting the via ring 20 is constituted by the Cu films 260 and 360 and the barrier metal films 240 and 340. In this case, a value obtained by adding a value obtained by multiplying the volume proportion of the Cu films 260 and 360 by the Young's modulus of Cu (130 GPa on an average) and a value obtained by multiplying the volume proportion of the barrier metal films 240 and 340 by the Young's modulus of the barrier metal material becomes the combined Young's modulus of the conductor constituting the via ring 20.

Therefore, a material whose Young's modulus is about 150 GPa or more is disposed as the crack stopper film 40 so that the Young's modulus of the crack stopper film 40 is larger than the combined Young's modulus of the via ring 20. Materials of the crack stopper film 40 include, for example, Cr, cobalt (Co), nickel (Ni), Nb, molybdenum (Mo), Ta, Ti, W, alloys containing these elements, compounds thereof, and laminated films thereof. By disposing materials whose Young's modulus is about 150 GPa or more, rigidity of the crack stopper film 40 can further be increased beyond that of the via ring 20. Rigidity of the crack stopper film 40 can further be increased because the crack stopper film 40 is formed from a material different from Al, which is the main material constituting the electrode pad 30, and Cu, which is the main material constituting the via ring 20, and having a large Young's modulus. The formation method is not limited to the PVD method and the CVD method may also be used. In the first embodiment, Cr (Young's modulus: 260 GPa) is used to form the crack stopper film 40 having the width of 10 μm and thickness of 0.5 μm. Thus, dielectric film cracks from a chip end can be prevented from occurring in chipping during dicing or in a reliability test after packaging.

Then, an $SiO_2$ film 532 to be the second layer in the laminated protective film PF is formed on the crack stopper film 40 and the surface of the SiN film 531 by using the plasma CVD method. Then, an SiN film 533 to be the third layer in the laminated protective film PF is formed on the $SiO_2$ film 532 by using the plasma CVD method. Corrosion of the crack stopper film 40 can be prevented by covering the crack stopper film 40 with the $SiO_2$ film 532 and the SiN film 533.

Subsequently, an electric furnace is used for sintering in a forming gas at 370° C. for 60 minutes. Next, the SiN film 531, the $SiO_2$ film 532, and the SiN film 533 covering the electrode pad 30 of Al are selectively removed by reactive ion etching (RIE) to form the opening 150 on the electrode pad 30 of Al. Then, dicing is performed to cut out the chip 14 to produce a semiconductor device having the structure shown in FIG. 1.

The chip 14 produced as described above was observed using an optical microscope to check for dielectric film interface peeling caused by chipping. In a target object in which the crack stopper film 40 is not formed, dielectric film interface peeling reaching into an inner part of the via ring area was observed at an interface between the dielectric film 220 and the etching stopper film 210 of the wiring layer 111 and between the dielectric film 320 and the etching stopper film 310 of the wiring layer 121 of some chips. In contrast, in a target object in which the crack stopper film 40 is formed, no dielectric film interface peeling reaching the via ring area was observed. After dicing, a chip in which no dielectric film interface peeling had been observed was picked out, mounted on a package substrate to perform Al wire bonding, and packaged using a sealing resin before performing a TCT test. The test was performed by repeating 1000 cycles of a heat history ranging from −40 to 125° C. As a result, while a defect such as dielectric film peeling was not caused by the TCT test in a target object in which the crack stopper film 40 was formed, defects were caused in a target object in which the crack stopper film 40 was not formed.

According to the first embodiment, as described above, in a semiconductor device in which the crack stopper film 40 is disposed like surrounding the effective wiring area 12 in a passivation film between a portion to be a chip end after dicing and an area where the effective wire 10 is disposed using a material whose Young's modulus is 150 GPa or more, an occurrence of dielectric film crack defects from a chip end was controlled in chipping during dicing or in a reliability test after packaging. As a result, a semiconductor device superior in quality, performance, and reliability, and also in productivity can be obtained by disposing the crack stopper film 40 using a material whose Young's modulus is 150 GPa or more as if to enclose the effective wiring area 12 between a portion to be a chip end after dicing and an area where the effective wire 10 is disposed in a Cu multilayer interconnection structure in which a low dielectric constant film whose relative dielectric constant is 3.4 or less is used as an inter-level dielectric. A low dielectric constant film has a tendency that mechanical strength declines as the relative dielectric constant decreases. Thus, an effect of dielectric film interface peeling being controlled by the crack stopper film 40 in the first embodiment grows still further in a low dielectric constant film whose relative dielectric constant is 2.6 or less.

Next, an effect of changing the thickness and width of the above crack stopper film 40 on dielectric film interface peeling strength was investigated by the m-ELT method, which is one of the peel strength evaluation methods. Cr was used as the crack stopper film 40, which was disposed with a width of 10 μm and like surrounding the effective wiring area 12, as shown in FIG. 2. At this point, target objects were prepared by changing the thickness of the crack stopper film 40 like 500 nm, 1 μm, and 1.5 μm. At the same time, a target object having no crack stopper film 40 was also prepared for reference. An epoxy resin having a thickness of 150 μm for the m-ELT method was formed on a prepared wafer and cut out on a dicing line to prepare slices for the m-ELT method.

Figure 8:
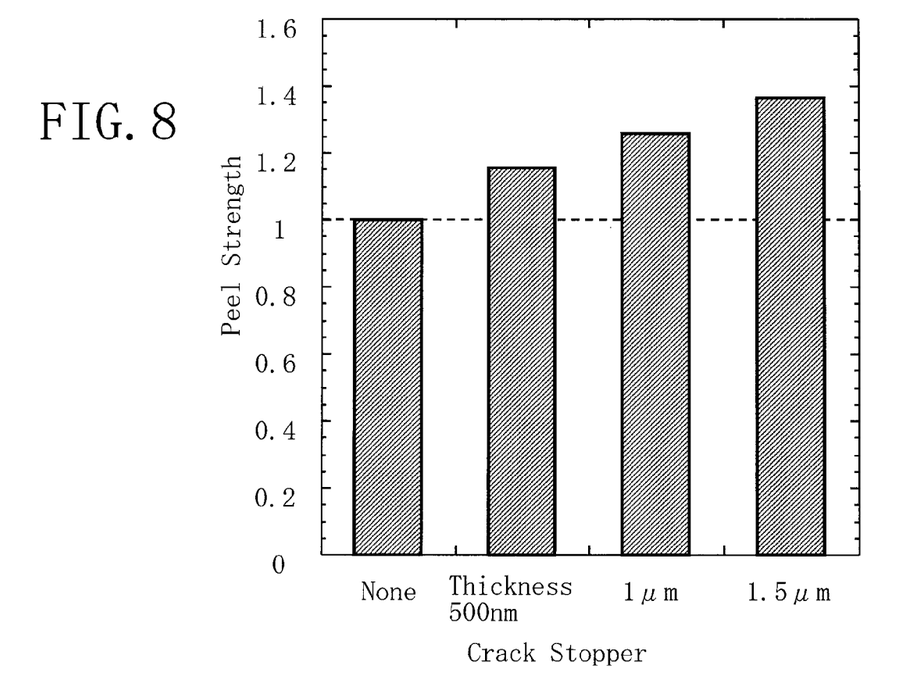
FIG. 8 is a diagram showing a result of performing a m-ELT (modified Edge Lift-off Test) by changing the thickness of the crack stopper film in the first embodiment.

FIG. 8 is a diagram showing a result of performing the m-ELT by changing the thickness of the crack stopper film in the first embodiment. Here, the m-ELT method was performed by using prepared slices. Interface peel strength of each target object is shown in graph form by setting the interface peel strength of a slice without the crack stopper film 40 for reference to 1. It is evident from the graph that all slices in which the crack stopper film 40 is disposed have interface peel strength greater than that of the slice without the crack stopper film 40 and the interface peel strength increases as the crack stopper film 40 becomes thicker.

Next, target objects were prepared by using Cr for the crack stopper film 40, disposing the crack stopper film 40 with a width of 500 μm and like surrounding the effective wiring area 12 as shown in FIG. 2, and changing the thickness thereof like 3 μm, 6 μm, 10 μm, and 15 μm. An epoxy resin having a thickness of 150 μm for the m-ELT method was formed on a prepared wafer and cut out on a dicing line to prepare slices for the m-ELT method.

Figure 9:
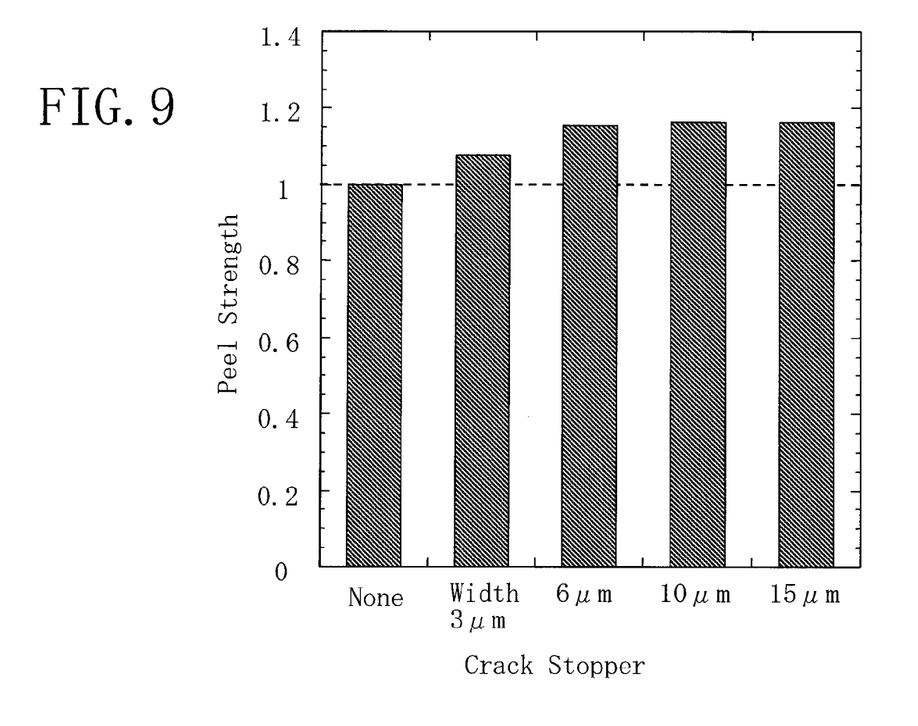
FIG. 9 is a diagram showing a result of performing the m-ELT by changing the width of the crack stopper film in the first embodiment.

FIG. 9 is a diagram showing a result of performing the m-ELT by changing the width of the crack stopper film in the first embodiment. The m-ELT method was performed by using prepared slices. Interface peel strength of each target object is shown in graph form by setting the interface peel strength of a slice without the crack stopper film 40 for reference to 1. It is evident from the graph that all slices in which the crack stopper film 40 is disposed have interface peel strength greater than that of the slice without the crack stopper film 40. While the peel strength increases as the crack stopper film 40 becomes wider, the peel strength becomes saturated when the width of the crack stopper film 40 is 10 μm or more.

It is evident, as described above, that a semiconductor device in the first embodiment in which the crack stopper film 40 is disposed has interface peel strength greater than that of a semiconductor device without the crack stopper film 40. It is also evident that an effect thereof grows as the crack stopper film 40 becomes thicker or wider.

Second Embodiment

In the first embodiment, as shown in FIG. 2, an example in which the crack stopper film 40 continuously encloses the effective wiring area 12 is shown, but the present invention is not limited to this.

Figure 10:
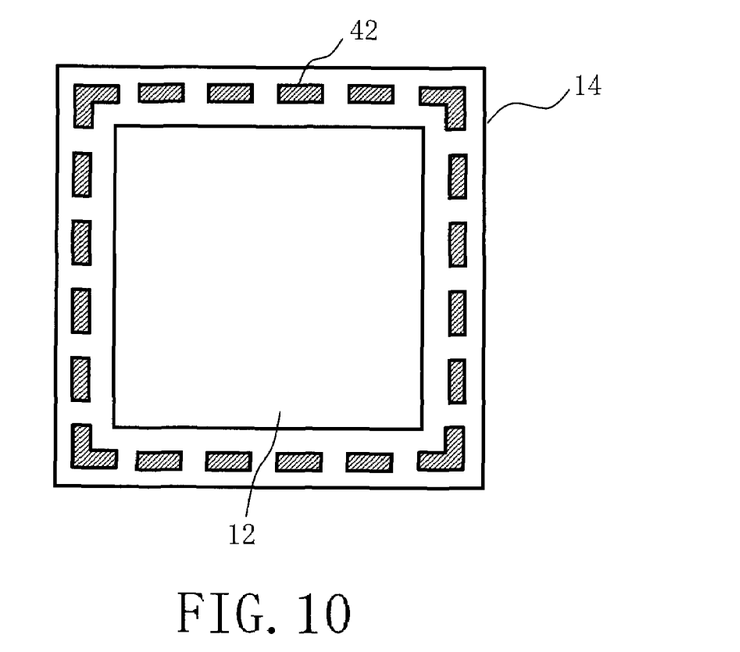
FIG. 10 is a conceptual diagram of a semiconductor device viewed from above for illustrating the arrangement position of a crack stopper film in a second embodiment.

FIG. 10 is a conceptual diagram of a semiconductor device viewed from above for illustrating the arrangement position of a crack stopper film in the second embodiment. As shown in FIG. 10, a crack stopper film 42 is arranged in an area between an end of the chip 14 and the effective wiring area 12 where the effective wire 10 is formed in such a way that the effective wiring area 12 is enclosed by the crack stopper film 42. In the second embodiment, however, the track stopper film 42 is arranged as if to intermittently (discontinuously) enclose the effective wiring area 12. The second embodiment is the same as the first embodiment except that the crack stopper film 40 is replaced by the crack stopper film 42 shown in FIG. 10. Even if the crack stopper film 42 is formed discontinuously, as described above, an occurrence of dielectric film cracks from a chip end can be controlled in chipping during dicing or in a reliability test after packaging.

Third Embodiment

In the second embodiment, as shown in FIG. 10, an example in which the crack stopper film 42 discontinuously encloses the effective wiring area 12 on all four sides is shown, but the present invention is not limited to this.

Figure 11:
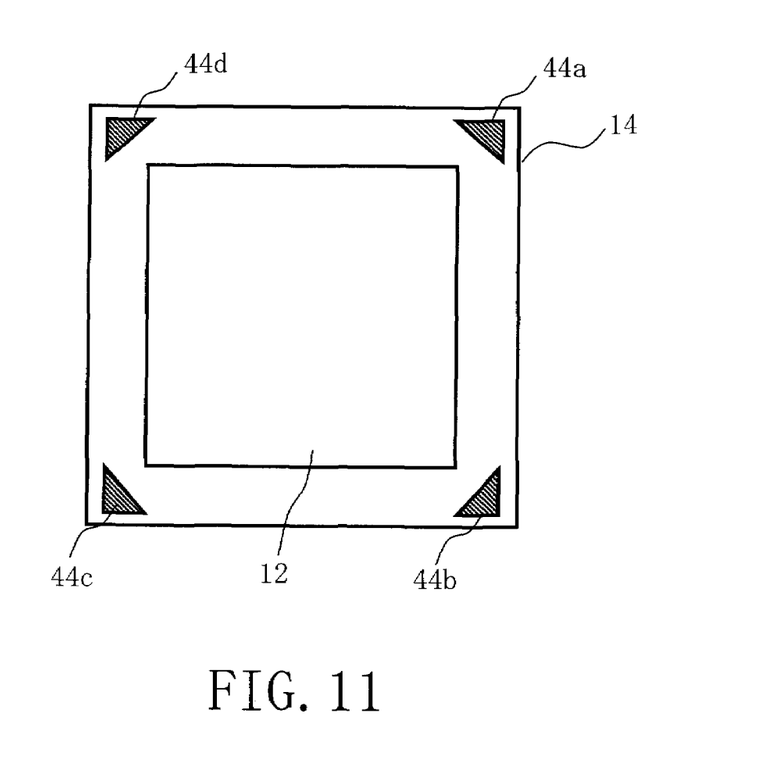
FIG. 11 is a conceptual diagram of a semiconductor device viewed from above for illustrating the arrangement position of a crack stopper film in a third embodiment.

FIG. 11 is a conceptual diagram of a semiconductor device viewed from above for illustrating the arrangement position of a crack stopper film in the third embodiment. As shown in FIG. 11, a crack stopper film 44 is arranged in an area between an end of the chip 14 and the effective wiring area 12 where the effective wire 10 is formed in such a way that the effective wiring area 12 is enclosed by the crack stopper film 42. In the third embodiment, however, crack stopper films 44a to 44d are arranged so that the crack stopper films 44a to 44d are formed near four corners of the chip 14 area. The third embodiment is the same as the first embodiment except that the crack stopper film 40 is replaced by the crack stopper film 44 shown in FIG. 11. An effect is still achieved even if, as described above, the crack stopper film 44 is arranged only on four corners under heaviest load during dicing or after packaging.

As described in each embodiment described above, crack stopper films are formed at least on four corners of a chip and an effect can be achieved by forming the crack stopper films as if to enclose an effective wiring area continuously or discontinuously.

Fourth Embodiment

In the fourth embodiment, a configuration in which a laser groove is further provided between the via ring 20 and a chip end to the configuration of the first embodiment will be described.

Figure 12:
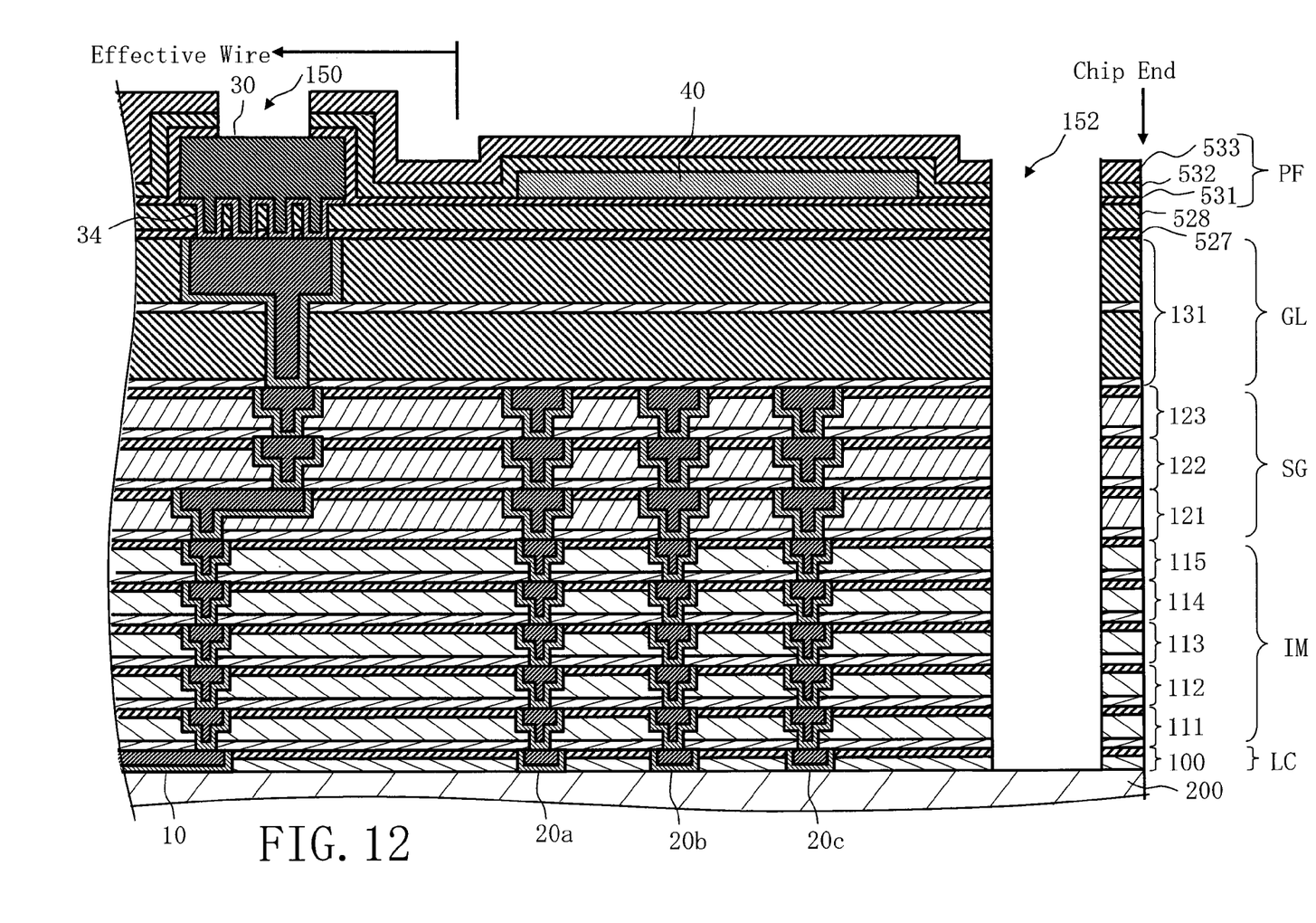
FIG. 12 is a conceptual diagram exemplifying the cross section of a semiconductor device according to a fourth embodiment.

FIG. 12 is a conceptual diagram exemplifying the cross section of a semiconductor device according to the fourth embodiment. In the fourth embodiment, an opening 152, which is a laser groove, continuing up to the substrate 200 is formed inside a laminated structure of inter-level dielectric in an area between the crack stopper film 40 and a chip area end as if to enclose the effective wiring area 12. By providing the opening 152 extending in a lamination direction of the multilayer interconnection structure, as described above, chipping during dicing can further be controlled. The opening 152 may be formed by laser irradiation. Thus, if a laser groove should be provided between the via ring 20 and a chip end, as shown in FIG. 12, the crack stopper film 40 may be arranged between a laser groove area and the effective wiring area 12. The fourth embodiment is the same as the first embodiment except that the opening 152 is provided. Or, the second embodiment or the third embodiment may be combined, or openings may be provided discontinuously on four sides of a chip or near four corners of a chip.

Fifth Embodiment

In each embodiment described above, the via ring 20 is formed only in wiring layers having a low-k film as an inter-level dielectric from the LC wiring layer to the SG wiring layer, but the present invention is not limited to this.

Figure 13:
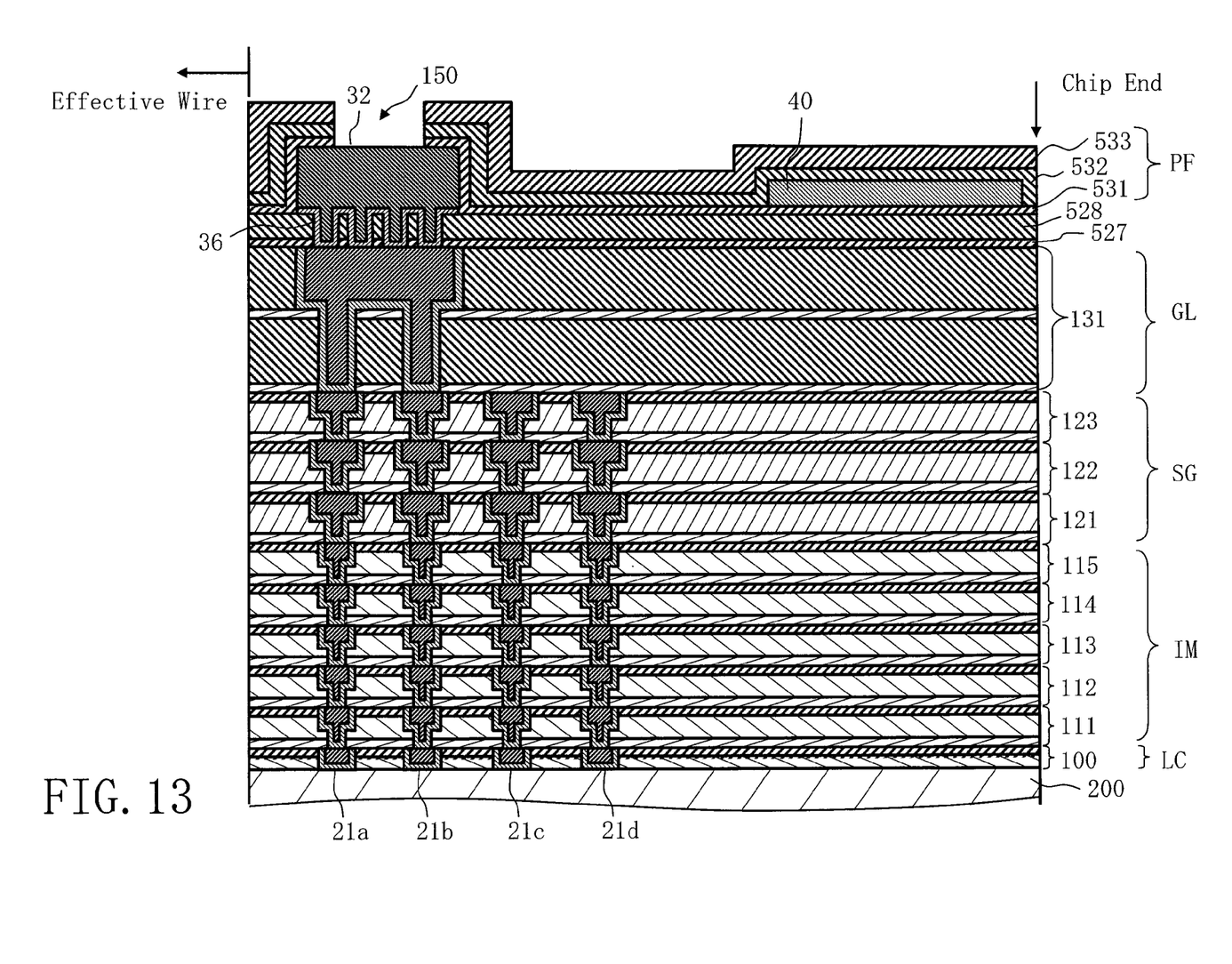
FIG. 13 is a conceptual diagram exemplifying the cross section of a semiconductor device according to a fifth embodiment.

FIG. 13 is a conceptual diagram exemplifying the cross section of a semiconductor device according to the fifth embodiment. FIG. 13 shows a case in which, among via rings 21a to 21d, the via rings 21a and 21b are connected up to an electrode pad 32 (second electrode pad). Here, a case in which the electrode pad 32 is arranged in the top layer of an area between an area in which an effective wire is formed and a chip area end is shown. The via rings 21a and 21b extend to the GL wiring layer 131 to be connected to the electrode pad 32 formed above the GL wiring layer 131. A barrier metal film 36 is formed on a sidewall and at a bottom of an Al plug connecting the electrode pad 32 and the via rings 21a and 21b.

Thus, the electrode pad 32 and the via rings 21a and 21b up to the electrode pad 32 may be formed around the effective wiring area 12. In each embodiment described above, an example in which the arrangement position of the crack stopper film 40 overlaps with an area in which the via ring 20 is arranged when viewed from above, but the present invention is not limited to this. As shown in FIG. 13, the arrangement position of the crack stopper film 40 may be an area between an area in which the via ring 20 is arranged and a chip end. Or, conversely, the crack stopper film 40 may be arranged between the effective wiring area 12 and an area in which the via ring 20 is arranged. Otherwise, the fifth embodiment is the same as the first embodiment described above. Or, the second embodiment or the third embodiment may be combined. Further, the fourth embodiment may be combined.

Sixth Embodiment

In each embodiment described above, the crack stopper film 40 is arranged by being sandwiched in a laminated structure of the laminated protective film PF, but the present invention is not limited to this.

Figure 14:
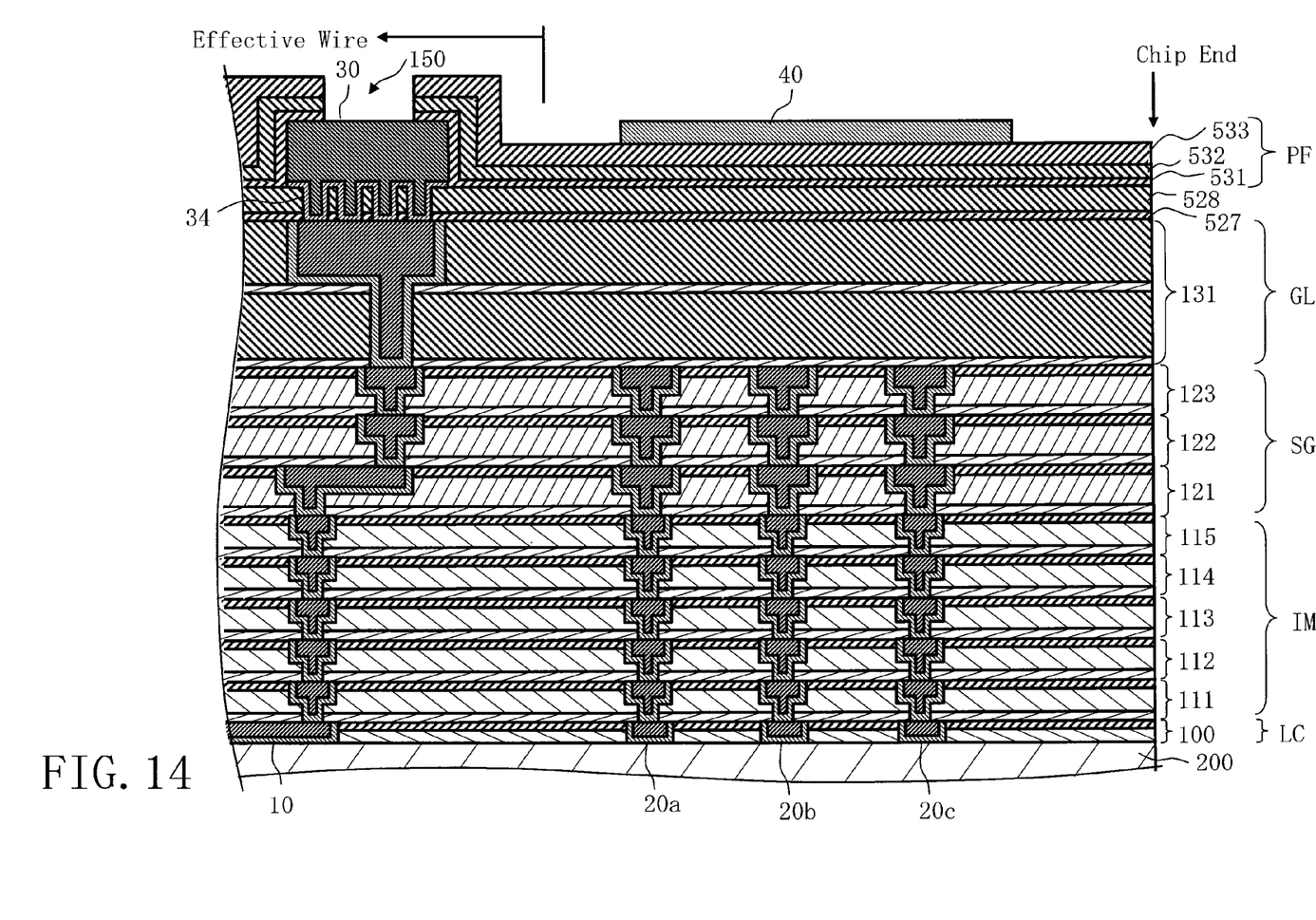
FIG. 14 is a conceptual diagram exemplifying the cross section of a semiconductor device according to a sixth embodiment.

FIG. 14 is a conceptual diagram exemplifying the cross section of a semiconductor device according to the sixth embodiment. As shown in FIG. 14, the crack stopper film 40 may be arranged on the SiN film 533. Even in such a case, a similar effect can be produced. Otherwise, the sixth embodiment is the same as the first embodiment described above. Or, the sixth embodiment may be combined with any or a plurality of the second to fifth embodiments.

According to each of the above embodiments, as described above, peeling resistance between wiring layers can be improved. Therefore, yields of semiconductor devices can be improved.

In the above description, a similar effect can be gained by using, in addition to Cu, materials having Cu as its main component used in the semiconductor industry such as a Cu—Sn alloy, Cu—Ti alloy, and Cu—Al alloy as a material of the wiring layers in each of the above embodiments. Or, a similar effect can be produced by using, in addition to Cu, Al or an Al alloy as a material of the wiring layers.

Embodiments of the present invention have been described above with reference to concrete examples. However, the present invention is not limited to these embodiments. For example, a dummy wire may be formed in an area between a via ring and a chip end by using a formation method similar to the above-described formation method of an effective wire.

Further, the thickness of inter-level dielectric, the size, shape, and number of openings and the like may be used by selecting what is needed for semiconductor integrated circuits and various semiconductor devices as needed.

In addition, all semiconductor devices and methods of fabricating a semiconductor device having elements of the present invention and whose design can be modified as needed by those skilled in the art are included in the scope of the present invention.

Though techniques normally used in the semiconductor industry, for example, a lithography process and cleaning before and after treatment are omitted for simplification of the description, these techniques are naturally included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
    an effective wire formed above a substrate in a multilayer interconnection structure and having a first electrode pad in a top layer;
    a first reinforcing material formed in the multilayer interconnection structure like surrounding the effective wire;
    a protective film configured to protect a final surface of the multilayer interconnection structure; and
    a second reinforcing material formed at a position in contact with the protective film and also between an area in which the effective wire is formed and a chip area end, the second reinforcing material being constituted by a film pattern whose Young's modulus is larger than that of a conductor constituting the first electrode pad and that of a conductor constituting the first reinforcing material.

2. The device according to claim 1, wherein the second reinforcing material is formed at least near four corners of the chip area end.

3. The device according to claim 1, wherein the second reinforcing material is formed like continuously surrounding an area in which the effective wire is formed.

4. The device according to claim 1, wherein the second reinforcing material is formed like discontinuously surrounding an area in which the effective wire is formed.

5. The device according to claim 1, wherein an opening extending in a lamination direction of the multilayer interconnection structure is formed in a dielectric film between an area in which the second reinforcing material is formed and the chip area end.

6. The device according to claim 1, wherein the protective film has a laminated structure in which a plurality of layers is laminated and the second reinforcing material is arranged by being sandwiched inside the laminated structure.

7. The device according to claim 1, wherein the second reinforcing material is formed above the first reinforcing material.

8. The device according to claim 1, wherein the second reinforcing material is formed between an area in which the first reinforcing material is formed and the chip area end.

9. The device according to claim 1, wherein the second reinforcing material is formed on the protective film.

10. The device according to claim 1, wherein the protective film is formed like covering the first electrode pad, and an opening is formed in the protective film and above the first electrode pad.

11. The device according to claim 1, wherein the first reinforcing material is a laminated via ring.

12. The device according to claim 11, wherein a plurality of rows of the via ring are arranged.

13. The device according to claim 1, further comprising:
    a second electrode pad arranged between an area in which the effective wire is formed and the chip area end and in a top layer of the multilayer interconnection structure,
    wherein the first reinforcing material is laminated up to the second electrode pad from a lower layer side.

14. The device according to claim 13, wherein the second reinforcing material is formed between an area in which the second electrode pad is formed and the chip area end.

15. The device according to claim 13, wherein the second reinforcing material is formed on a side of the chip area end from an area in which the first reinforcing material is formed.

16. The device according to claim 1, further comprising:
    a second electrode pad arranged between an area in which the effective wire is formed and the chip area end and in a top layer of the multilayer interconnection structure,
    wherein a plurality of rows of via ring are formed toward the chip area end as the first reinforcing material and a part of the plurality of rows of via ring is laminated up to the second electrode pad from a lower layer side.

17. The device according to claim 16, wherein the second reinforcing material is formed on a side of the chip area end from the plurality of rows of via ring.

18. The device according to claim 1, wherein a material whose Young's modulus is 150 GPa or more is used for the second reinforcing material.

19. The device according to claim 1, wherein the second reinforcing material contains one of chrome (Cr), cobalt (Co), nickel (Ni), niobium (Nb), molybdenum (Mo), tantalum (Ta), titanium (Ti), and tungsten (W).

20. The device according to claim 1, wherein the multilayer interconnection structure contains a wiring layer using a dielectric film whose relative dielectric constant is 3.4 or less as an inter-level dielectric film.

* * * * *